(12) United States Patent
Rokhsaz et al.

(10) Patent No.: US 10,224,902 B2
(45) Date of Patent: *Mar. 5, 2019

(54) ROLL-TO-ROLL PRODUCTION OF RFID TAGS

(75) Inventors: Shahriar Rokhsaz, Austin, TX (US); Stanley Drobac, Atherton, CA (US)

(73) Assignee: RFMicron, Inc., Austin, TX (US)

( * ) Notice: Subject to any disclaimer, the term of this patent is extended or adjusted under 35 U.S.C. 154(b) by 767 days.

This patent is subject to a terminal disclaimer.

(21) Appl. No.: 13/467,925

(22) Filed: May 9, 2012

(65) Prior Publication Data

US 2012/0217311 A1   Aug. 30, 2012

Related U.S. Application Data

(60) Continuation-in-part of application No. 13/209,425, filed on Aug. 14, 2011, now Pat. No. 9,048,819, which is a continuation-in-part of application No. 12/462,331, filed on Aug. 1, 2009, now Pat. No. 8,081,043, which is a division of application No. 11/601,085, filed on Nov. 18, 2006, now Pat. No. 7,586,385.

(60) Provisional application No. 61/485,732, filed on May 13, 2011, provisional application No. 61/428,170, filed on Dec. 29, 2010.

(51) Int. Cl.
| | | |
|---|---|---|
| G06K 19/067 | (2006.01) |
| H03J 3/20 | (2006.01) |
| G06K 19/07 | (2006.01) |
| G06K 19/077 | (2006.01) |
| H03J 1/00 | (2006.01) |

(52) U.S. Cl.
CPC ............ *H03J 3/20* (2013.01); *G06K 19/0726* (2013.01); *G06K 19/07718* (2013.01); *H03J 1/0075* (2013.01); *H03J 2200/10* (2013.01); *Y10T 29/49016* (2015.01)

(58) Field of Classification Search
CPC ........ H03J 3/20; H03J 1/0075; H03J 2200/10; G06K 19/0726; G06K 19/07718; Y10T 29/49016
USPC .................................. 340/10.1, 572.1, 572.7
See application file for complete search history.

(56) References Cited

U.S. PATENT DOCUMENTS 4,656,463 A * 4/1987 Anders et al. ............. 340/573.4
5,396,251 A * 3/1995 Schuermann ......... G01S 7/4008
                                                          342/42

(Continued)

OTHER PUBLICATIONS

Fernald, Cook, Miller & Paulos; A Microprocessor-Based Implantable Telemetry System; Computer, pp. 23-30, Mar. 1991.

(Continued)

*Primary Examiner* — Edwin C Holloway, III
(74) *Attorney, Agent, or Firm* — Garlick & Markison; Timothy W. Markison

(57) ABSTRACT

A method and apparatus for manufacturing thin RFID tags adapted to be mounted proximate an interfering substance, such as metal or liquid. Each tag comprises: a web substrate having a predetermined thickness; an antenna attached to the substrate; and an RFID integrated circuit connected to the antenna, the RFID integrated circuit comprising a tank circuit adapted to be tuned in response to an RF signal after the tag has been mounted proximate the interfering substance. In one embodiment, the tag is manufactured using roll-to-roll manufacturing technology.

13 Claims, 4 Drawing Sheets

(56) References Cited

U.S. PATENT DOCUMENTS

| | | | |
|---|---|---|---|
| 6,019,865 | A | 2/2000 | Palmer et al. |
| 6,104,291 | A | 8/2000 | Beauvillier et al. |
| 6,107,920 | A | 8/2000 | Eberhardt et al. |
| 6,272,321 | B1 | 8/2001 | Bruhnke et al. |
| 6,280,544 | B1 | 8/2001 | Fox et al. |
| 6,784,813 | B2 | 8/2004 | Shanks et al. |
| 7,055,754 | B2 | 5/2005 | Forster |
| 6,922,134 | B1 * | 7/2005 | Yones ................. B60C 23/0408 340/10.51 |
| 6,940,408 | B2 | 9/2005 | Ferguson et al. |
| 6,951,596 | B2 | 10/2005 | Green et al. |
| 7,158,037 | B2 | 1/2007 | Forster et al. |
| 7,768,400 | B2 | 8/2010 | Lawrence et al. |
| 9,048,819 | B2 * | 6/2015 | Rokhsaz .................... H03J 3/20 |
| 2004/0112964 | A1 * | 6/2004 | Empedocles ........... B82Y 10/00 235/491 |
| 2005/0104790 | A1 * | 5/2005 | Duron ................ G06K 19/0723 343/745 |
| 2005/0184922 | A1 * | 8/2005 | Ida et al. ....................... 343/861 |
| 2005/0237198 | A1 | 10/2005 | Waldner et al. |
| 2006/0054710 | A1 * | 3/2006 | Forster ..................... H01Q 1/22 235/492 |
| 2006/0230966 | A1 | 10/2006 | Brod et al. |
| 2006/0276987 | A1 | 12/2006 | Bolander et al. |
| 2007/0273481 | A1 * | 11/2007 | Soleimani ............ H01Q 1/2225 340/10.1 |
| 2008/0055091 | A1 | 3/2008 | Song et al. |
| 2010/0026468 | A1 * | 2/2010 | Nyalamadugu .. G06K 19/07345 340/10.51 |
| 2016/0188927 | A1 * | 6/2016 | Rokhsaz ............. G06K 7/10366 340/10.4 |

OTHER PUBLICATIONS

Fernald, Paulos, Stackhouse & Heaton; A Self-Tuning Digital Telemetry IC for Use in a Microprocessor-Based Implantable Instrument; J. Solid-State Cir., v.27, pp. 1826-1832, Dec. 92.

Fernald, Paulos, Stackhouse & Heaton; An Implantable Digital Telemetry IC Using an Automatic Resonant-Frequency Search Technique; ISSCC 92, WP 4.4.

Fernald, Stackhouse, Paulos & Miller; A System Architecture for Intelligent Implantable Biotelemetry Instruments; Proc. IEEE Eng in Medicine Conf, pp. 1411-1412, Nov. 1989.

Paulos, Fernald & Poulton; Custom ICs for Biomedical Applications; Proc. 1st Symp. Comm., Signal Proc, Expert Sys & ASIC VLSI Design, pp. 45-48, Mar. 1990; w/slides.

Paulos & Miller; Analog Circuits NSF/ERC Core A.2; Proc. IEEE Eng in Medicine Conf., pp. 677-678, Nov. 1990; w/slides.

Stackhouse; A Transmitter Circuit Design for an Implantable Biomedical Chip Set; Masters Thesis, NC State Univ, E&CE Dept., 1989.

Fernald; A Microprocessor-Based System for the Fast Prototyping of Implantable Instruments for Biomedical Research Application; PhD Thesis, NC State Univ, E&CE Dept., 1992.

T. A. Scharfeld, "An Analysis of the Fundamental Constraints on Low Cost Passive Radio-Frequency Identification System Design", MIT (Aug. 2001).

Zhongkai Zhong, "An Analog Cell Library Useful for Artificial Neural Networks", IEEE Proceedings—1990 Southeastcon.

Omni-D US, Inc., "Omni-ID Flex LP and AI" product datasheet (2012).

Xerafy Ltd., "Metal Skin Brochure" (2012).

\* cited by examiner

ROLL-TO-ROLL PRODUCTION OF RFID TAGS

CROSS-REFERENCE TO RELATED APPLICATIONS

This application is a Continuation-In-Part of application Ser. No. 13/209,425, filed 14 Aug. 2011 ("Related Application"), which claims the benefit of the Parent Provisional Two and U.S. Provisional Application Ser. No. 61/428,170, filed 29 Dec. 2010 ("Parent Provisional One"). The Related Application is in turn a Continuation-In-Part of application Ser. No. 12/462,331, filed 1 Aug. 2009, now U.S. Pat. No. 8,081,043, issued 20 Dec. 2011 ("Related Patent One"), which is in turn a Division of application Ser. No. 11/601,085, filed 18 Nov. 2006, now U.S. Pat. No. 7,586,385, issued 8 Sep. 2009 ("Related Patent Two").

This application claims priority to U.S. Provisional Application Ser. No. 61/485,732, filed 13 May 2011, ("Parent Provisional Two"), and hereby claims benefit of the filing date thereof pursuant to 37 CFR § 1.78(a)(4).

This application is related to application Ser. No. 13/209,420, filed simultaneously with Application Ser. No. 13/209,425, on 14 Aug. 2011 ("Related Co-application").

The subject matter of the Related Application, Parent Provisional One, Related Patent One, Related Patent Two, Parent Provisional Two and Related Co-application (collectively, "Related References"), each in its entirety, is expressly incorporated herein by reference.

BACKGROUND OF THE INVENTION

1. Field of the Invention

The present invention relates generally to manufacturing RFID tag webstock, and, in particular, to high-speed roll-to-roll manufacture of RFID tag webstock.

2. Description of the Related Art

In general, in the descriptions that follow, we will italicize the first occurrence of each special term of art that should be familiar to those skilled in the art of radio frequency ("RF") communication systems. In addition, when we first introduce a term that we believe to be new or that we will use in a context that we believe to be new, we will bold the term and provide the definition that we intend to apply to that term. In addition, throughout this description, we will sometimes use the terms assert and negate when referring to the rendering of a signal, signal flag, status bit, or similar apparatus into its logically true or logically false state, respectively, and the term toggle to indicate the logical inversion of a signal from one logical state to the other. Alternatively, we may refer to the mutually exclusive boolean states as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

In accordance with our prior invention previously disclosed in the Related References, the amplitude modulated ("AM") signal broadcast by the reader in an RFID system will be electromagnetically coupled to a conventional antenna, and a portion of the current induced in a tank circuit is extracted by a regulator to provide operating power for all other circuits. Once sufficient stable power is available, the regulator will produce, e.g., a power-on-reset signal to initiate system operation. Thereafter, the method disclosed in the Related References, and the associated apparatus, dynamically varies the capacitance of a variable capacitor component of the tank circuit so as to dynamically shift the $f_R$ of the tank circuit to better match the $f_c$ of the received RF signal, thus obtaining maximum power transfer in the system.

In accordance with our invention, an RFID tag may be manufactured using roll-to-roll production technology. Several such manufacturing techniques have been disclosed, for example, in the following patent application publications and issued patents (collectively "Manufacturing Examples"), each of which, in its entirety, is expressly incorporated herein by reference:

Eberhardt, et al., "Radio Frequency Identification TAG Having An Article Integrated Antenna", U.S. Pat. No. 6,107,920, issued 22 Aug. 2000 ("Eberhardt");

Green, et al., "RFID Label Technique", U.S. Pat. No. 6,951,596, issued 4 Oct. 2005 ("Green");

Ferguson, et al., "RFID Device And Method Of Forming", U.S. Pat. No. 6,940,408, issued 6 Sep. 2005 ("Ferguson");

Forster, et al., "Low Cost Method Of Producing Radio Frequency Identification TAGS With Straps Without Antenna Patterning", U.S. Pat. No. 7,158,037, issued 2 Jan. 2007 ("Forster");

Brod, et al., "Device And Method For Printing A Web", US 2006/0230966, published 19 Oct. 2006 ("Brod");

Lawrence, et al., "Electromagnetic Radiation Decoupler", US 7,768,400, issued 3 Aug. 2010 ("Lawrence");

Fox, et al., "RF TAG Application System", U.S. Pat. No. 6,280,544, issued 28 Aug. 2001 ("Fox"); and Palmer, et al., "Method Of Forming Labels Containing Transponders", U.S. Pat. No. 6,019,865, issued 1 Feb. 2000 ("Palmer").

Typical, prior-art methods of roll-to-roll manufacturing of RFID tags are shown in Green and Brod. Disadvantages of such prior art roll-to-roll manufactured tags include performance which is, at best, severely limited if the tag is attached proximate an interfering substance. By this term, we mean any substance, material, composition of matter, or the like, usually at least partially electrically conductive, that significantly affects the impedance of the tag's antenna. In such applications, tags may be mounted, for example, on a metal surface, on an outside portion of a container of liquid, or, in an extreme example, immersed, in whole or in part, in a container of liquid. Prior art designs, e.g., Lawrence, typically achieve usable on-metal performance by using thicker substrates, sometimes in combination with multiple layers of metal. However, both thick substrates and additional metal layers add substantial cost to tag manufacturing. In addition, the thickness required by prior-art designs has meant that tags had to be produced and handled in singulated form, rather than in long continuous rolls. As a result, such prior-art metal-mount tags have not been adopted in high-volume applications that require high-speed automated processing using roll-form RFID labels. Known efforts to decrease the thickness of the substrate of the final, converted tags using available RFID chips have proven impractical. In general, a metal-mount tag must be tuned properly to operate when the tag's antenna is a given standoff distance from the metal surface to which the tag is mounted (where the standoff distance is determined by the substrate thickness under the antenna plus the thickness of any mounting adhesive). As the standoff distance decreases, the bandwidth of a tag dramatically changes and its center frequency becomes more dependent on the exact standoff distance. As the standoff distance gets below about 1 mm, it becomes economically impractical to attain the tight manufacturing tolerances required to manufacture metal-mount tags. Thus, while some prior-art tags can be tuned to adjust for typical standoff distances, no known prior-art metal-mount tags can be manufactured reliably at standoff distances below about 1 mm. Attempts also have been made to thin the substrate by using various specialized materials; however this typically adds unacceptable cost to the finished product.

In general, the inventions disclosed in the Related References focused primarily on maximizing the total power transferred into the chip by automatically adjusting the input impedance of the transceiver (receiver) to match the impedance of the antenna connected to the impedance of the receiver. The inventions focused on a form and manner that is suitable for selectively varying the input impedance of the receiver circuit to maximize received power, especially during normal system operation. Additionally, in light of the power sensitive nature of RFID systems, those inventions further focused on varying the input impedance with a minimum power loss. We submit that what is needed now is a tag adapted to employ our inventions as disclosed in the Related References to produce thinner, more cost effective RFID tags with improved manufacturing robustness. In particular, it is desirable to produce such thin RFID tags compatible with state-of-the-art roll-to-roll manufacturing technologies. It is further desirable to develop such thin RFID tags to achieve a reliable state-of-the-art read range, even when mounted proximate interfering substances. Additionally, keeping in mind the cost sensitive nature of RFID technology in general, it is desirable to produce such thin RFID tags wherein the manufacturing costs, material costs, and physical dimensions are generally optimized as compared to the prior art.

BRIEF SUMMARY OF THE INVENTION

In accordance with the preferred embodiment of our invention, we provide an RFID tag adapted to be mountable proximate an interfering substance, such as, for example, a metal or a liquid. In general, the RFID tag comprises a substrate having a predetermined thickness, and an antenna mounted on the substrate. An RFID integrated circuit is connected to the antenna, the RFID integrated circuit comprising a tank circuit adapted to be tuned in response to an RF signal after the tag has been mounted proximate the interfering substance. In one embodiment, the substrate comprises a roll of flexible web, and the tag is manufactured using roll-to-roll manufacturing technology.

We also provide a method we prefer for manufacturing an RFID tag adapted to be mountable proximate an interfering substance, such as, for example, a metal or a liquid. Generally, the steps comprise: attaching an antenna to a web substrate having a predetermined thickness; attaching an RFID integrated circuit, comprising a tank circuit adapted to be tuned in response to an RF signal; connecting the antenna to the RFID integrated circuit; converting the tag; separating the tag from the web; mounting the tag proximate the interfering substance; and tuning the tank circuit using an RF signal.

BRIEF DESCRIPTION OF THE SEVERAL VIEWS OF THE DRAWINGS

Our invention may be more fully understood by a description of certain preferred embodiments in conjunction with the attached drawings in which.

Figure 1:
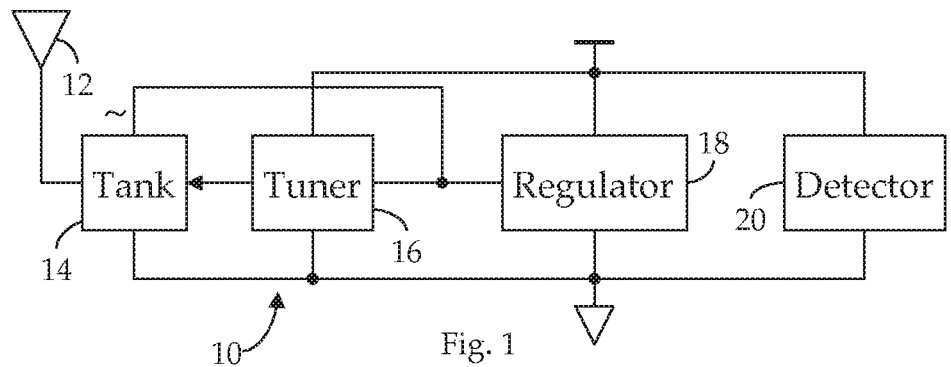
FIG. 1 illustrates, in block diagram form, an RF receiver circuit having a field strength detector constructed in accordance with an embodiment of our invention.

In the drawings, similar elements will be similarly numbered whenever possible. However, this practice is simply for convenience of reference and to avoid unnecessary proliferation of numbers, and is not intended to imply or suggest that our invention requires identity in either function or structure in the several embodiments.

DETAILED DESCRIPTION OF THE INVENTION

Shown in FIG. 1 is an RF receiver circuit 10 suitable for use in an RFID application. As we have described in our Related References, an RF signal electromagnetically coupled to an antenna 12 is received via a tank circuit 14, the response frequency, $f_R$, of which is dynamically varied by a tuner 16 to better match the transmission frequency, $f_C$, of the received RF signal, thus obtaining a maximum power transfer. In particular, as further noted in the Related References, the RMS voltage induced across the tank circuit 14 by the received RF signal is quantized by tuner 16 and the developed quantization employed to control the impedance of the tank circuit 14. As also described in the Related References, the unregulated, AC current induced in the tank circuit 14 by the received RF signal is conditioned by a regulator 18 to provide regulated DC operating power to the receiver circuit 10. In accordance with our invention, we provide a field strength detector 20, also known as a power detector, adapted to develop a field-strength value as a function of the field strength of the received RF signal. As we have indicated in FIG. 1, our field strength detector 20 is adapted to cooperate with the regulator 18 in the development of the field-strength value. If desired, our field strength detector 20 can be adapted to cooperate with the tuner 16 in controlling the operating characteristics of the tank circuit 14.

Figure 2:
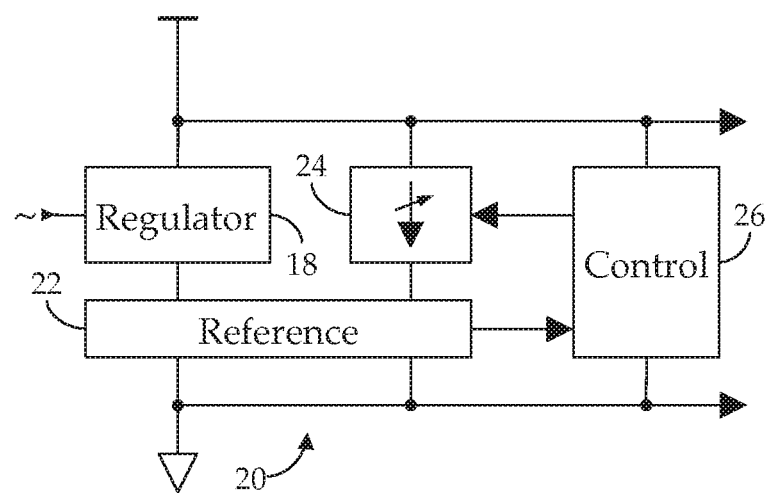
FIG. 2 illustrates, in block diagram form, a field strength detector circuit constructed in accordance with an embodiment of our invention.

As we have described in our Related Application, FIG. 2 is one possible embodiment of our field strength or power detector 20. In this embodiment, we have chosen to employ a shunt-type regulator 18 so that, during normal operation, we can use the shunted 'excess' current as a reference against which we develop the field-strength value. In this regard, we use a reference 22 first to develop a shunt current reference value proportional to the shunted current, and then to develop a mirrored current reference value as a function of both the shunted current and a field strength reference current provided by a digitally-controlled current source 24. Preferably, once the tuner 16 has completed its initial operating sequence, whereby the $f_R$ of the tank circuit 14 has been substantially matched to the $f_C$ of the received signal, we then enable a digital control 26 to initiate operation of the current source 24 at a predetermined, digitally-established minimum field strength reference current. After a predetermined period of time, control 26 captures the mirrored current reference value provided by the current reference 22, compares the captured signal against a predetermined threshold value, and, if the comparison indicates that the field strength reference current is insufficient, increases, in accordance with a predetermined sequence of digital-controlled increments, the field strength reference current; upon the comparison indicating that the field strength reference current is sufficient, control 26 will, at least temporarily, cease operation.

Figure 3:
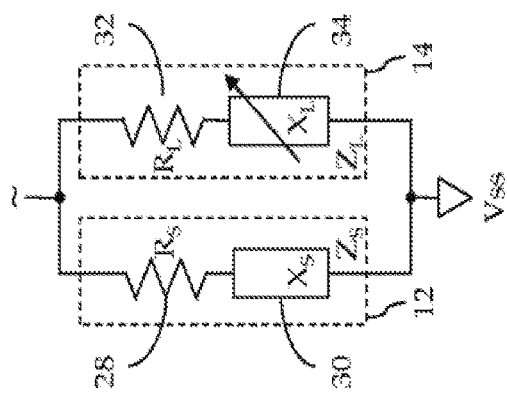
FIG. 3 illustrates, in block schematic form, an alternative representation of the impedance represented by the antenna and the tank circuit of the exemplary RFID receiver circuit.

Note that the source impedance of antenna 12 and load impedance of tank circuit 14 may be represented alternatively in schematic form as in FIG. 3, wherein antenna 12 is represented as equivalent source resistance $R_S$ 28 and equivalent source reactance $X_S$ 30, and tank circuit 14 is represented as equivalent load resistance $R_L$ 32 and equivalent, variable load reactance $X_L$ 34.

As we have described in our Related Application, our invention may be adapted to sense the environment to which a tag is exposed, as well as sensing changes to that same environment. The auto-tuning capability of tuner 16 acting in conjunction with tank circuit 14 detects antenna 12 impedance changes. These impedance changes may be a function of environmental factors such as proximity to interfering substances, e.g., metals or liquids, as well as a function of a reader or receiver antenna orientation. Likewise, as disclosed herein, our field strength (i.e., received power) detector 20 may be used to detect changes in received power (i.e., field strength) as a function of, for example, power emitted by the reader, distance between tag and reader, physical characteristics of materials or elements in the immediate vicinity of the tag and reader, or the like. Sensing the environment or, at least, changes to the environment is accomplished using one or both of these capabilities.

Figure 4:
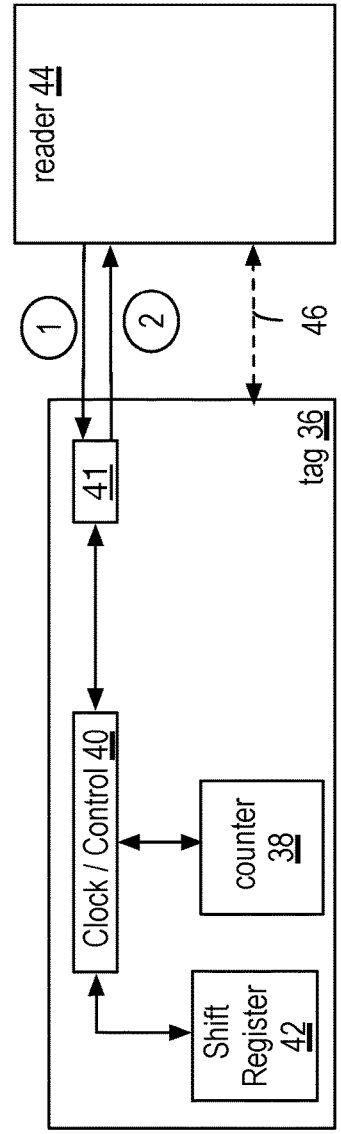
FIG. 4 illustrates, in block schematic form, an exemplary RFID sub-system containing tag and reader.

As we have described in our Related Application, the tag 36 of FIG. 4, contains both a source tag antenna 12 (not shown, but see, e.g., FIG. 1) and a corresponding load chip tank circuit 14 (not shown, but see, e.g., FIG. 1). Each contains both resistive and reactive elements as discussed previously (see, e.g., FIG. 3). A tag 36 containing such a tank circuit 14 mounted on a metallic surface will exhibit antenna impedance that is dramatically different than the same tag 36 in free space or mounted on a container of liquid. Table 1 displays exemplary values for impedance variations in both antenna source resistance 28 as well as antenna source reactance 30 as a function of frequency as well as environmental effects at an exemplary frequency:

TABLE 1

| Antenna Impedance Variations | | | |
|---|---|---|---|
| In Free Air | 860 MHz | 910 MHz | 960 MHz |
| $R_S$ | 1.9 | 2.5 | 3.7 |
| $X_S$ | 124 | 136 | 149 |
| @ 910 MHz | Free Air | On Water | On Metal |
| $R_S$ | 2.5 | 26 | 1.9 |
| $X_S$ | 136 | 136 | 27 |

The tuner circuit 16 of our invention as disclosed in the Related References automatically adjusts the load impendence by adjusting load reactance 34 (see, e.g., FIG. 3) to match source antenna impedance represented by source resistance 28 (see, e.g., FIG. 3) and source reactance 30 (see, e.g., FIG. 3). As previously disclosed, matching of the chip load impedance and antenna source impedance can be performed automatically in order to achieve maximum power transfer between the antenna and the chip. Our invention as disclosed in the Related References contained a digital shift register 42 for selectively changing the value of the load reactive component, in the present case a variable capacitor, until power transfer is maximized. This digital value of the matched impendence may be used either internally by the tag 36, or read and used by the reader 44, to discern relative environmental information to which the tag 36 is exposed. For example, tag 36 may contain a calibrated look-up-table within the clock/control circuit 40 which may be accessed to determine the relevant environmental information. Likewise, a RFID reader 44, operable within a predetermined read range 46, may issue commands (see transaction 1 in FIG. 4) to retrieve (see transaction 2 in FIG. 4) the values contained in digital shift register 42 via conventional means, and use that retrieved information to evaluate the environment to which tag 36 is exposed. The evaluation could be as simple as referencing fixed data in memory that has already been stored and calibrated, or as complex as a software application running on the reader or its connected systems for performing interpretive evaluations.

Likewise, consider a tag 36 containing our field strength (i.e., received power) detector 20 (not shown, but, e.g., see FIG. 1) wherein the method of operation of the system containing the tag 36 calls for our field strength detector 20 to selectively perform its sweep function and developing the quantized digital representation of the current via the method discussed earlier.

As illustrated in FIG. 4, counter 38 will contain the digital representation developed by our field strength detector 20 of the RF signal induced current, and may be used either internally by the tag 36, or read and used by the reader 44, to discern relative environmental information to which the tag 36 is exposed. For example, reader 44 may issue a command to the tag 36 (see transaction 1 in FIG. 4) to activate tuner 16 and/or detector 20 and, subsequent to the respective operations of tuner 16 and/or detector 20, receive, via the transceiver (e.g., transmitter and receiver) 41 (see transaction 2 in FIG. 4), the digital representations of either the matched impedance or the maximum current developed during those operations. Once again, this digital value of the field strength stored in the counter 38 may be used either internally by the tag 36, or read (via the transceiver 41) and used by the reader 44, to discern relative environmental information to which the tag 36 is exposed. For example, tag 36 may contain a calibrated look-up-table within the clock and control block 40 which may be accessed to determine the relevant environmental information. Likewise, a RFID reader may issue commands to retrieve the values contained in digital shift register 42, and use that retrieved information to evaluate the environment to which tag 36 is exposed. The evaluation could be as simple as referencing fixed data in memory that has already been stored and calibrated, or as complex as a software application running on the reader or its connected systems for performing interpretive evaluations. Thus, the combining of the technologies enables a user to sense the environment to which a tag 36 is exposed as well as sense changes to that same environment.

The various embodiments of our inventions as disclosed in the Related References may be applied to manufacturing thinner RFID tags with improved cost and robustness. Such embodiments achieve maximum efficiency of the power transfer between the antenna 12 and the receiver circuit 10, even as the proximity to an interfering substance amplifies the impact of manufacturing variations on tag performance. By taking advantage of our inventions disclosed in the Related References, we gain the ability to compensate for those manufacturing variations. Prior art structures, which have fixed tuning, are not able to adjust impedance (and hence frequency response) in order to maintain acceptable performance over a reasonable range of manufacturing tolerances for thin tags. Thinning the physical dimensions is now practical as we take advantage of our inventions to dynamically shift the $f_R$, of the tank circuit 14 to better match the $f_C$ of the received RF signal, thus obtaining maximum power transfer in the system. Also, it follows that we significantly relax the need to use precision materials for the substrate, and the need for precision manufacturing processes, both of which typically add unacceptable cost to the finished product. It also follows that a robust and reliable state-of-the-art read range may be achieved, for example, greater than one meter.

Figure 5:
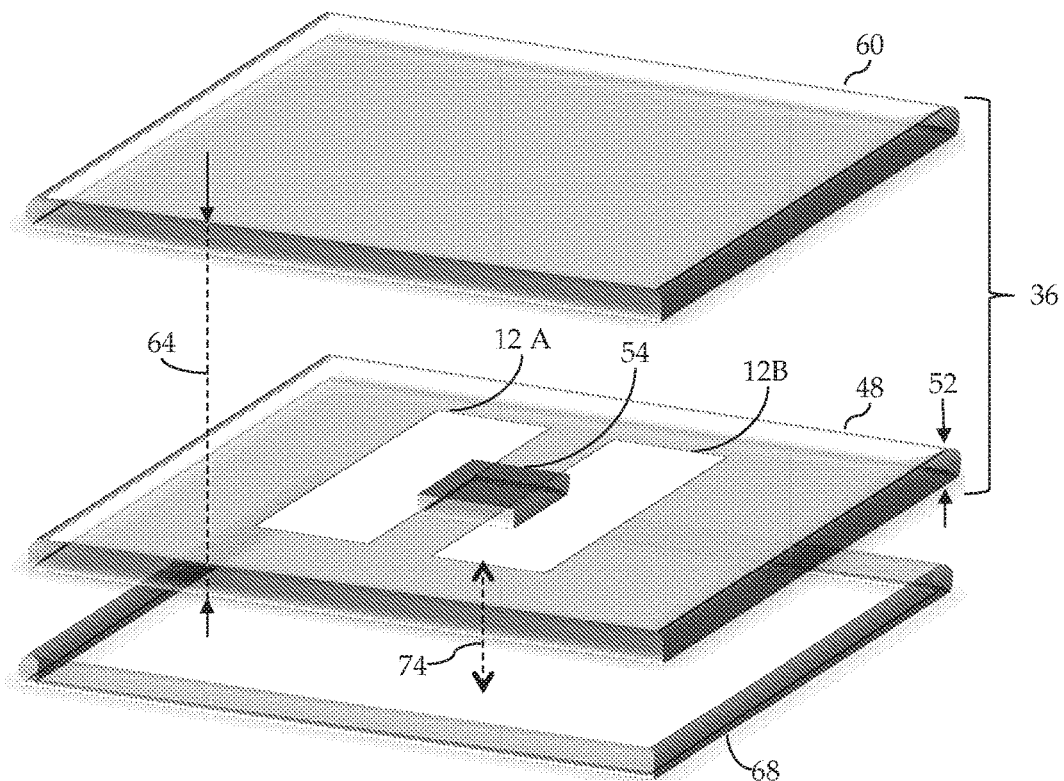
FIG. 5 illustrates, in block schematic form, an exemplary thin RFID tag, integrated on a flexible substrate and adapted to be mountable proximate interfering substances using roll-to-roll manufacturing.
Figure 6:
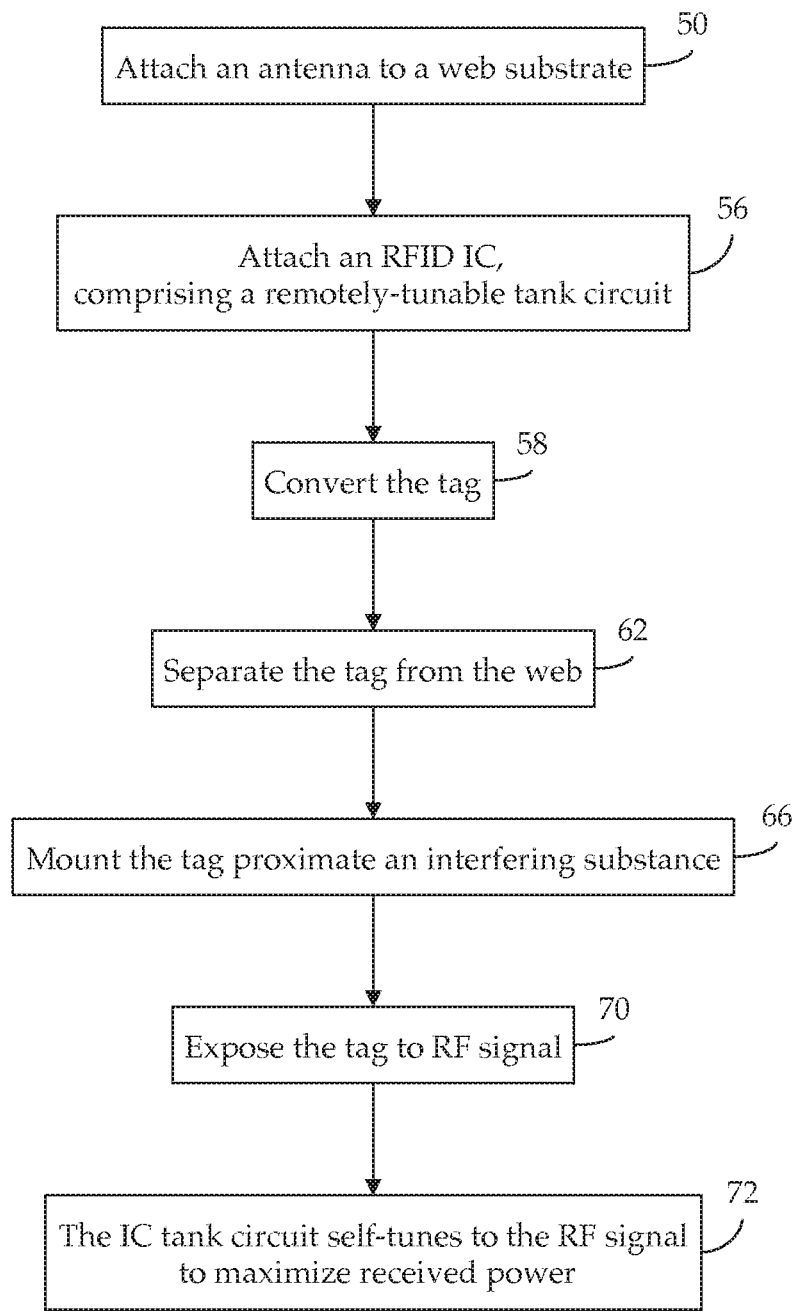
FIG. 6 illustrates, in flow diagram form, the sequencing of the manufacturing operations of the RFID tag of FIG. 5.

Shown in FIG. 5 is a thin RFID tag 36 we believe to be well suited for use in RFID applications requiring the tag 36 to be mounted proximate interfering substances; and in FIG. 6 is an exemplary method for manufacturing the tag 36. For our tag 36, a predetermined antenna topology 12 (see, generally, FIG. 1), comprising, for example, antenna segments 12A and 12B, is attached (including, by definition, any of printed, formed, deposited, adhered or other suitable manufacturing method now known or hereafter developed) on a web substrate 48 (step 50). Typically the substrate 48 comprises a flexible, insulating material such as a plastic, e.g., Polyethylene Terephthalate ("PET"), with a predetermined thickness 52 less than about 1 mm, and preferably within the range of 0.1 mm to 0.2 mm. Then, an RFID integrated circuit ("IC") 54, comprising a remotely-tunable tank circuit 14 (see, generally, FIG. 1), is attached to the substrate 48/antenna 12 (step 56), either with a flip-chip process that simultaneously accomplishes the mechanical attachment and electrical connection, or with an alternative process that may require separate placement and connection. The tag 36 may be converted by coating, laminating, adhering or printing any additional layers required for the intended application (step 58), for example the protective layer 60 (which may comprise a printable feedstock) or, perhaps, an adhesive layer (not shown) on the bottom of the substrate 48. Any of the known cutting techniques can be used to separate each tag 36 from the web (step 62). Each completed tag 36, having a total thickness 64, may now be mounted, using known techniques, proximate any interfering substance (step 66), for example, a metal surface 68. Finally, the tag 36 is exposed to a suitable continuous-wave RF signal (step 70), for example, using a conventional reader 44 (see, generally, FIG. 4). Using our inventions as disclosed in the Related References, the tank circuit 14 (see, generally, FIG. 1) of the IC 54 will automatically self-tune to the RF signal (step 72) so as to maximize received power. Once tuned, tag 36 is fully operable as mounted on the metal surface 68. Accordingly, we define the term remotely-tunable to mean both our self-tuning technology (see, Related References) and any other methodology or technology by means of which the RFID IC's tank circuit 14 can be tuned after conversion, and, in particular, after mounting in proximity to an interfering substance. As noted in the Related References, post-manufacturing self-tuning, as employed here, is greatly facilitated by initially tuning the tank circuit 14 during manufacture of the IC 54.

Our thin RFID tag 36 may comprise various embodiments that take advantage of methods and apparatus of our inventions as disclosed in the Related References. Referring back to FIG. 5, by way of example, our thin RFID tag 36 is inherently compatible with state-of-the-art roll-to-roll manufacturing on a flexible web substrate 48, yet our thin RFID tag 36 is far less subject to the various disadvantages discussed above. In general, keeping in mind the cost sensitive nature of RFID technology and taking advantage of our inventions as fully disclosed in our Related References, we may produce thinner RFID tags 36 wherein the manufacturing costs, material costs, and physical dimensions are generally optimized as compared to the prior art. Also, our thin RFID tag 36 achieves maximum efficiency of the power transfer between the antenna 12 and the receiver circuit 10, notwithstanding environmental factors such as proximity to interfering substances 68, e.g., metals or liquids, and poor placement of the tag reader 44 (see, generally, FIG. 4) relative to antenna 12. Since our RFID IC 54 preferably comprises a self-tunable tank circuit 14, we may use our thin RFID tag 36 to operate reliably when the antenna 12 is at a standoff distance 74 less than 1 mm from the metal surface 68 to which the tag 36 is mounted.

In one embodiment, an RFID system for use in an RFID application comprises our thin RFID tag 36, which comprises a tank circuit 14 having a selectively variable impedance. The RFID tag 36 also comprises a tuning circuit 16 which dynamically varies the impedance of the tank circuit 14, and develops a first quantized value representative of the impedance of the tank circuit 14. The RFID tag 36 also comprises a detector circuit 20 which develops a second quantized value as a function of a field strength of a received RF signal. The RFID system comprises an RFID reader 44 which retrieves the first and second values and uses the retrieved values to sense changes to an environment to which the RFID tag 36 is exposed.

In another embodiment, our thin RFID tag 36 comprises a field strength reference generator 22 to develop a field strength reference current as a function of a field strength of a received RF signal; and a field strength quantizer to develop a digital field-strength value indicative of the field strength reference current.

In yet another embodiment, detected field strength is used to dynamically vary the impedance of a tank circuit 14 whereby, over time, induced current is maximized.

In yet another embodiment, the quantized field strength is used to sense changes to the environment to which the RFID tag 36 is exposed.

Thus it is apparent that we have provided an effective and efficient method and apparatus for applying our inventions as disclosed in the Related References to produce thinner RFID tags with much improved manufacturing robustness. Our thin RFID tags are compatible, for example, with state-of-the-art roll-to-roll manufacturing on a flexible web substrate. Also, our thin RFID tags achieve maximum efficiency of the power transfer between the antenna 12 and the receiver circuit 10, even as environmental factors such as proximity to interfering substances, e.g., metals or liquids, as well as reader or receiver antenna orientation work to degrade the antenna tuning performance. Our thin RFID tags achieve a state-of-the-art read range. Additionally, our thin RFID tags achieve improved manufacturing costs, material costs, and physical dimensions that are generally optimized as compared to the prior art. Those skilled in the art will recognize that modifications and variations can be made without departing from the spirit of our invention. There-

What we claim is:

1. A radio frequency identification (RFID) tag comprising:
   a substrate having a predetermined thickness;
   an antenna mounted on the substrate;
   a variable tank circuit coupled to the antenna;
   a tuner coupled to the variable tank circuit, wherein, when the RFID tag is not exposed to an interfering substance, the RFID tag has a first resonant frequency, and when the RFID tag is exposed to the interfering substance, impedance of the antenna is changed causing a change in resonant frequency of the RFID tag to a second resonant frequency, wherein the tuner adjusts impedance of the variable tank circuit to substantially compensate for the antenna impedance change thereby adjusting the resonant frequency of the RFID tag to be substantially the first resonant frequency, and wherein the tuner generates a digital value indicative of an amount of impedance adjustment of the variable tank circuit, wherein the digital value is operable to be interpreted by a radio frequency (RF) reader to determine characteristics of the interfering substance, wherein the characteristics include one or more of a proximity of the interfering substance to the RFID tag, an environmental condition, a metal, a free space, and a liquid; and
   a transmitter operable to convert the digital value into an outbound RF signal and to transmit the outbound RF signal to the RF reader.

2. The RFID tag of claim 1 wherein the substrate comprises a roll of flexible web and wherein thickness of the substrate is within the range of 0.02 millimeter (mm) to 0.2 mm.

3. The RFID tag of claim 1 further comprises:
   an integrated circuit mounted on the substrate, wherein the integrated circuit includes the variable tank circuit, the tuner, and the transmitter.

4. The RFID tag of claim 3 further comprises:
   a protective layer attached to a first surface of the substrate and substantially covering the antenna and the integrated circuit.

5. The RFID tag of claim 4 further comprises:
   an adhesive layer attached to a second surface of the substrate, wherein the second surface is substantially opposite of the first surface of the substrate.

6. The RFID tag of claim 1 further comprises:
   a power regulator operable to convert an inbound radio frequency (RF) signal into a direct current (DC) power supply voltage; and
   a power detector operable to detect a received signal strength of the inbound RF signal and generate a second digital value indicative of the received signal strength.

7. The RFID tag of claim 1 wherein the tuner is further operable to:
   adjust the impedance of the variable tank circuit to the digital value within a range of digital values, wherein the range of digital values corresponds to impedance adjustments of the variable tank circuit when the RFID tag is in free space, in a liquid, or within 1 millimeter of metal.

8. A method for manufacturing a radio frequency identification (RFID) tag, the method comprising:
   connecting a plurality of RFID integrated circuits to a web substrate, wherein the web substrate has attached thereto a plurality of antennas, wherein an RFID integrated circuit of the plurality of RFID integrated circuits is electrically connected an antenna of the plurality of antennas, wherein the RFID integrated circuit includes:
      a variable tank circuit coupled to the antenna;
      a tuner coupled to the variable tank circuit, wherein, when the RFID tag is not exposed to an interfering substance, the RFID tag has a first resonant frequency, and when the RFID tag is exposed to the interfering substance, impedance of the antenna is changed causing a change in resonant frequency of the RFID tag to a second resonant frequency, wherein the tuner adjusts impedance of the variable tank circuit to substantially compensate for the antenna impedance change thereby adjusting the resonant frequency of the RFID tag to be substantially the first resonant frequency, and wherein the tuner generates a digital value indicative of an amount of impedance adjustment of the variable tank circuit, wherein the digital value is operable to be interpreted by a radio frequency (RF) reader to determine characteristics of the interfering substance, wherein the characteristics include one or more of a proximity of the interfering substance to the RFID tag, an environmental condition, a metal, a free space, and a liquid; and
      a transmitter operable to convert the digital value into an outbound RF signal and to transmit the outbound RF signal to the RF reader;
   adhering a layer of a first surface of the web substrate; and
   separating the RFID integrated circuit and the antenna from the web substrate to produce the RFID tag.

9. The method of claim 8, wherein the web substrate comprises a roll of flexible web.

10. The method of claim 8, wherein the RFID tag is manufactured using roll-to-roll manufacturing technology.

11. The method of claim 8 further comprises:
    attaching the plurality of antennas to the web substrate using one or more of printing, depositing, and adhering.

12. The method of claim 8, wherein the thickness of the web substrate is preferably within the range of 0.02 mm to 0.2 mm.

13. The method of claim 8 wherein the interfering substance comprises a selected one of a metal and a liquid.

* * * * *